United States Patent
So (10) Patent No.: US 7,144,762 B2
(45) Date of Patent: Dec. 5, 2006

(54) SEMICONDUCTOR DEVICE WITH PINS AND METHOD OF ASSEMBLING THE SEMICONDUCTOR DEVICE

(75) Inventor: Tsuyoshi So, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 88 days.

(21) Appl. No.: 10/941,943

(22) Filed: Sep. 16, 2004

(65) Prior Publication Data

US 2005/0248026 A1    Nov. 10, 2005

(30) Foreign Application Priority Data

May 6, 2004    (JP)    ............................. 2004-137688

(51) Int. Cl.
*H01L 21/00*    (2006.01)
*H05K 7/20*    (2006.01)

(52) U.S. Cl. ...................................... 438/122; 361/709

(58) Field of Classification Search ........ 257/E23.083; 438/122
See application file for complete search history.

(56) References Cited

U.S. PATENT DOCUMENTS

| | | | |
|---|---|---|---|
| 5,384,940 A | * | 1/1995 | Soule et al. ................... 24/453 |
| 5,761,041 A | * | 6/1998 | Hassanzadeh et al. ...... 361/704 |
| 5,870,286 A | * | 2/1999 | Butterbaugh et al. ....... 361/704 |
| 5,978,223 A | * | 11/1999 | Hamilton et al. ............ 361/704 |
| 6,307,747 B1 | * | 10/2001 | Farnsworth et al. ......... 361/704 |
| 2003/0159819 A1 | * | 8/2003 | Lee .............................. 165/185 |
| 2005/0072558 A1 | * | 4/2005 | Whitney et al. ............ 165/80.3 |

FOREIGN PATENT DOCUMENTS

JP    30-64402    9/1999

OTHER PUBLICATIONS

Partial Translation of Japanese Registered Utility Model No. 30-64402.

* cited by examiner

*Primary Examiner*—Lex H. Malsawma
(74) *Attorney, Agent, or Firm*—Staas & Halsey LLP (57) ABSTRACT

A semiconductor device includes a substrate having a semiconductor element mounted thereon, and a heat sink. A plurality of pins are inserted in holes in the heat sink and holes in the substrate to secure the heat sink to the substrate. The pin has an enlarged portion at one end thereof and an engaging portion at the other end thereof. An engaging member is provided to engage with the engaging portions of the pins that pass though the holes in the heat sink and the holes in the substrate and protrude from the substrate. Springs are arranged between the enlarged portions of the pins and the heat sink. In assembling the semiconductor device, the pins are held collectively by a holding member, and after the semiconductor device is assembled, the holding member is removed from the pins.

6 Claims, 8 Drawing Sheets

SEMICONDUCTOR DEVICE WITH PINS AND METHOD OF ASSEMBLING THE SEMICONDUCTOR DEVICE

BACKGROUND OF THE INVENTION

1. Field of the Invention

The present invention relates to a semiconductor device and a method of assembling the semiconductor device.

2. Description of the Related Art

In a semiconductor device including a semiconductor element that generates a large amount of heat such as a CPU, it is conventional to arrange a heat sink in contact with the semiconductor element to remove the heat generated by the semiconductor element. In many cases, the heat sink is secured by screws to the substrate on which the semiconductor element is mounted.

The structure for securing the heat sink to the substrate by using screws requires laborious work for attaching the screws, thus increasing the cost. Therefore, a structure has been proposed for securing the heat sink to the substrate without using screws (see, for example, Japanese Registered Utility Model No. 3064402).

In this prior art, a holding member has a plurality of pins collectively attached thereto and an engaging member engages with the distal ends of the pins. The holding member having a plurality of pins is arranged on one side of the substrate and the heat sink, which are superposed one on another, and the engaging member is arranged on the other side of the substrate and the heat sink. The pins are inserted in the holes of the substrate and the holes of the heat sink, and the distal ends of the pins protrude from the heat sink. The protruding distal ends of the pins engage with the engaging member. Therefore, the substrate and the heat sink are held between and by the holding member and the engaging member. The engaging member includes a portion which is parallel to the heat sink and an engaging portion which is so curved as to separate away from the heat sink. The portion which is parallel to the heat sink has holes through which the pins are inserted. When the engaging member is moved transversely along the heat sink, the ends of the pins are placed on the curved engaging portion which, therefore, undergoes an elastic deformation. Therefore, the heat sink is elastically pressed onto the substrate and is attached as a unitary structure.

In the conventional structure for securing the heat sink to the substrate without using screws, the pins are fixed to the holding member, so that even after the substrate and the heat sink are assembled into a unit as a semiconductor device, the holding member remains secured to the pins forming part of the semiconductor device. Therefore, holding members having a plurality of pins must be provided in a large number, resulting in an increase in the cost and an increase in the weight of the semiconductor device. When the holding member has a large outer shape, the semiconductor device assumes a correspondingly large outer shape. Besides, the movable engaging member may cause the position of the pins to be moved if an external force, such as vibration or shock, is exerted thereon.

SUMMARY OF THE INVENTION

It is an object of the present invention to provide a semiconductor device which can be produced at a low cost and in which a heat sink can be secured to a substrate without using screws, and a method of assembling such a semiconductor device.

A semiconductor device, according to the present invention, comprises a substrate having a semiconductor element mounted thereon, a heat sink in contact with the semiconductor element for cooling the semiconductor element, a plurality of pins inserted in a plurality of holes in the heat sink and a plurality of holes in the substrate, the pins having enlarged portions at one end thereof, an engaging member engaging with the other ends of the pins that pass though the holes in the heat sink and the holes in the substrate and protrude from the substrate, and springs arranged between the enlarged portions of the pins and the heat sink.

In this constitution, the heat sink and the substrate are assembled in a unit, and in close contact with each other, by the pins and the springs. The pins are separate from each other and are formed in a minimum shape. It is therefore allowed to obtain a semiconductor device having a compact outer shape.

A method of assembling a semiconductor device, according to the present invention, comprises the steps of arranging, in a holding member, a plurality of pins having enlarged portions at the one ends thereof and springs arranged in contact with the enlarged portions, placing a heat sink on a substrate, moving at least one of the holding member and an assembly of the heat sink and the substrate placed one on another toward each other to insert the pins held by the holding member in a plurality of holes in the heat sink and a plurality of holes in the substrate and to compress the springs so that the heat sink and the substrate are closely contacted to each other, bringing the other ends of the pins passing through the holes in the heat sink and the holes in the substrate and protruding from the substrate into engagement with an engaging member, and removing the holding member from the pins.

In this constitution, the heat sink and the substrate are assembled in a unit in close contact closely with each other by the pins and the springs. The pins are separated from each other and can be formed in the smallest shape. The pins are first arranged in the holding member, and therefore, the pins can be inserted at one time in the holes in the heat sink and the holes in the substrate while compressing the springs by the holding member. This facilitates the assembling work of the semiconductor device. The holding member is finally removed from the pins, and therefore, the shape and the weight of the semiconductor device can be decreased. The holding member can be repetitively used, and there is no need to provide many holding members.

In this manner, according to the present invention, the heat sink and the substrate can be closely contacted together, as a unit, by the pins and the springs, without using screws. In assembling the semiconductor device, the pins are handled in a state of being arranged on the holding member. After the semiconductor device is assembled, the holding member can be removed from the pins. It is therefore possible to obtain a semiconductor device having a compact outer shape.

DESCRIPTION OF THE PREFERRED EMBODIMENT

Figure 1:
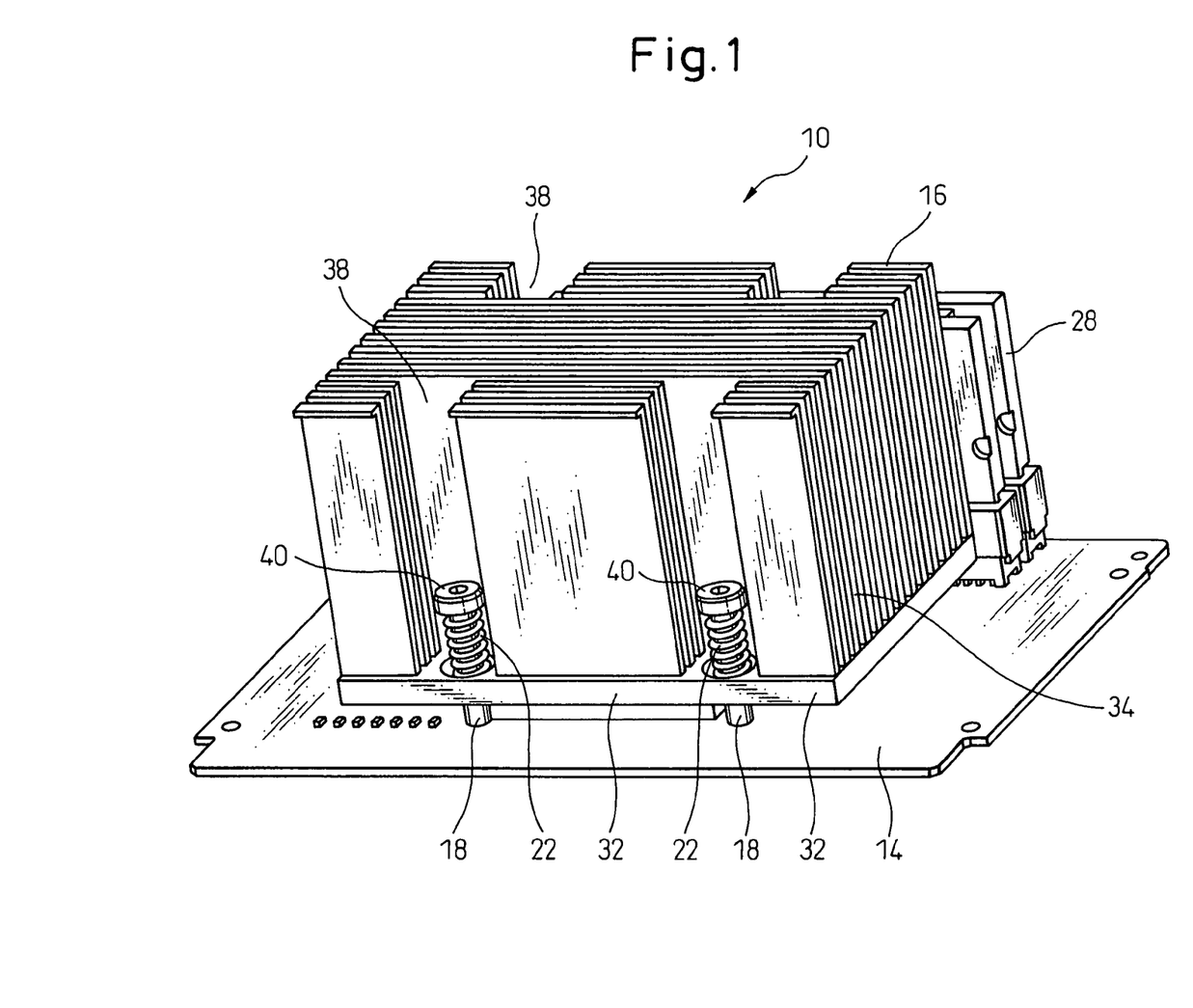
FIG. 1 is a perspective view illustrating a semiconductor device according to an embodiment of the present invention.
Figure 2:
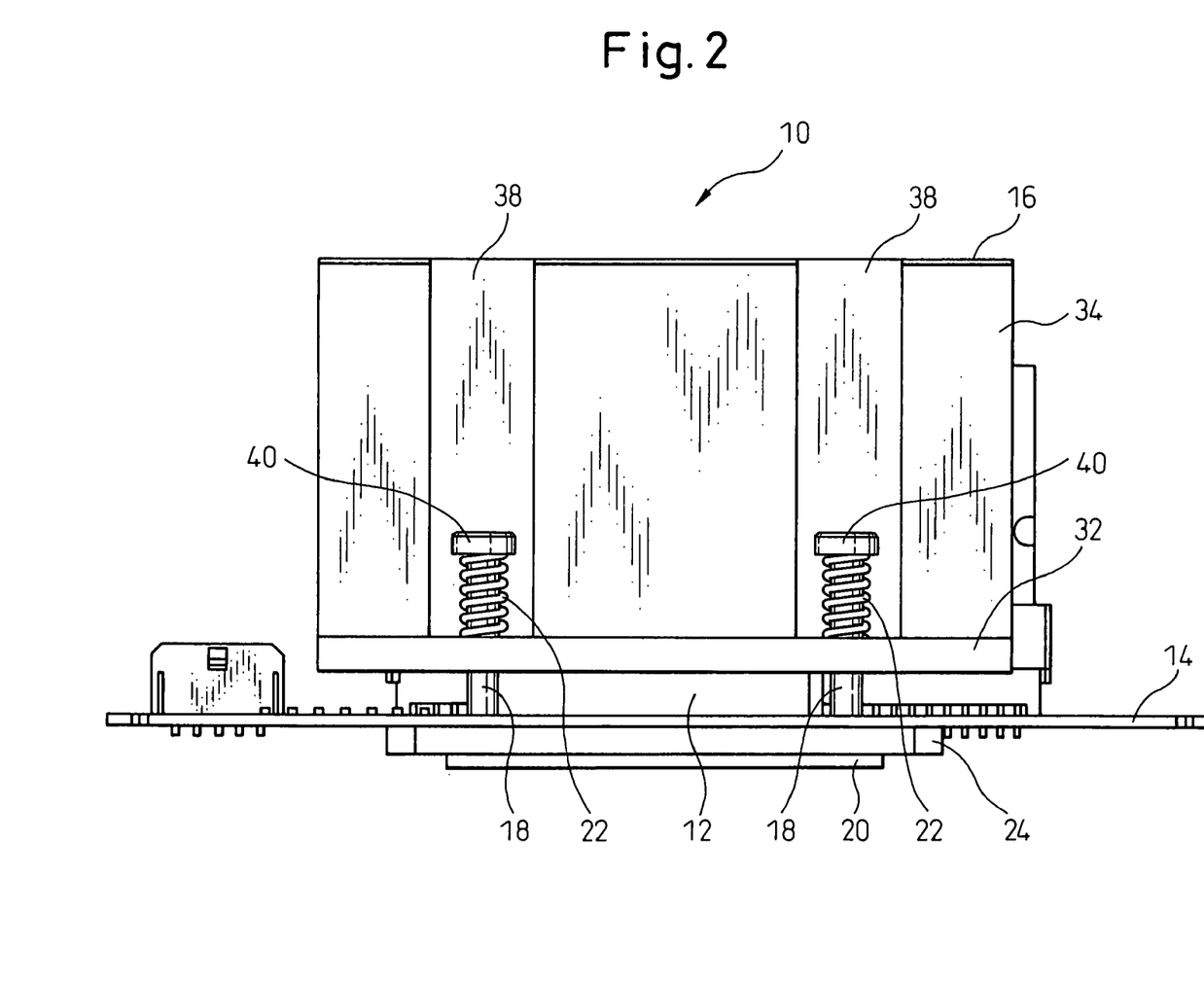
FIG. 2 is a side view illustrating the semiconductor device of FIG. 1.
Figure 3:
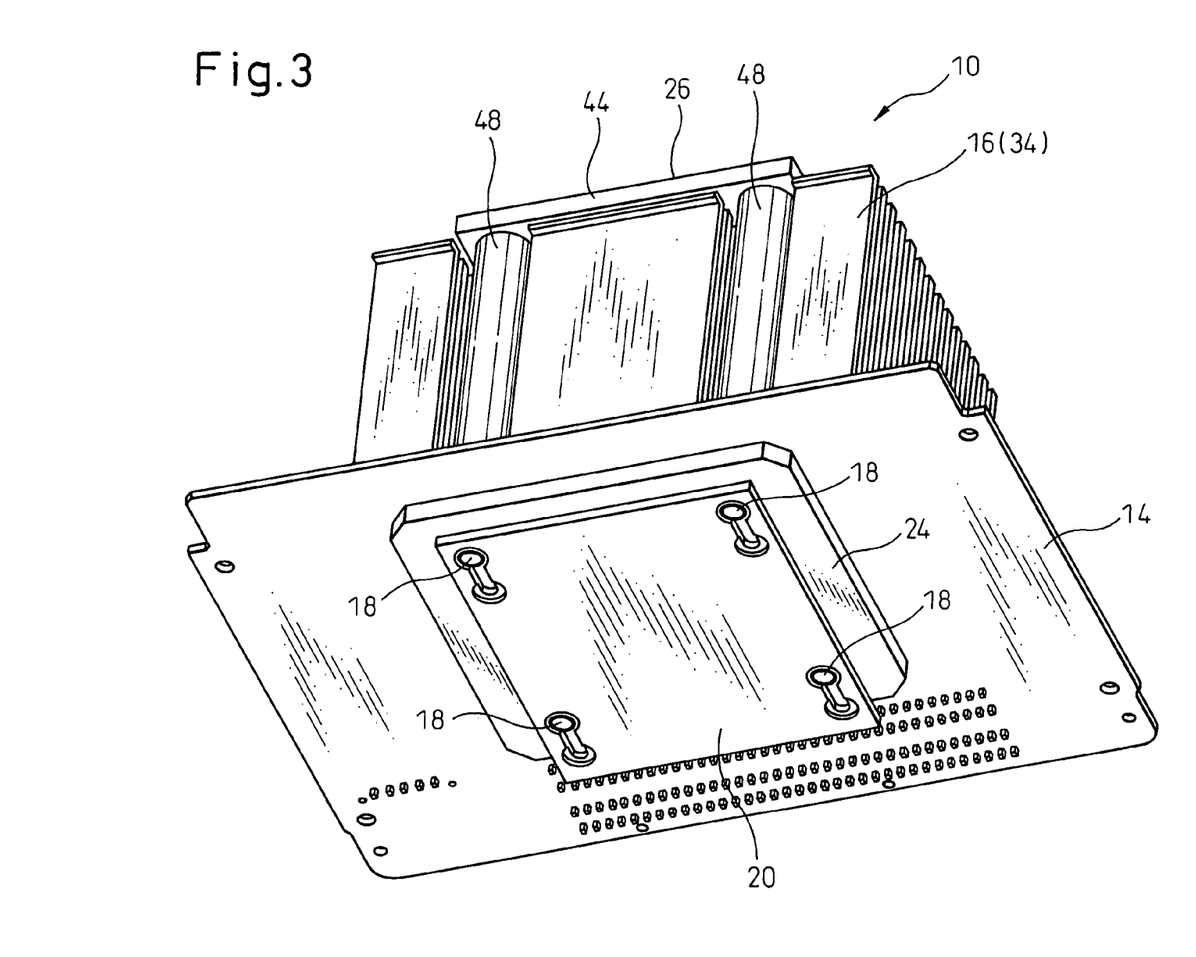
FIG. 3 is a perspective view illustrating,the semiconductor device being assembled.
Figure 4:
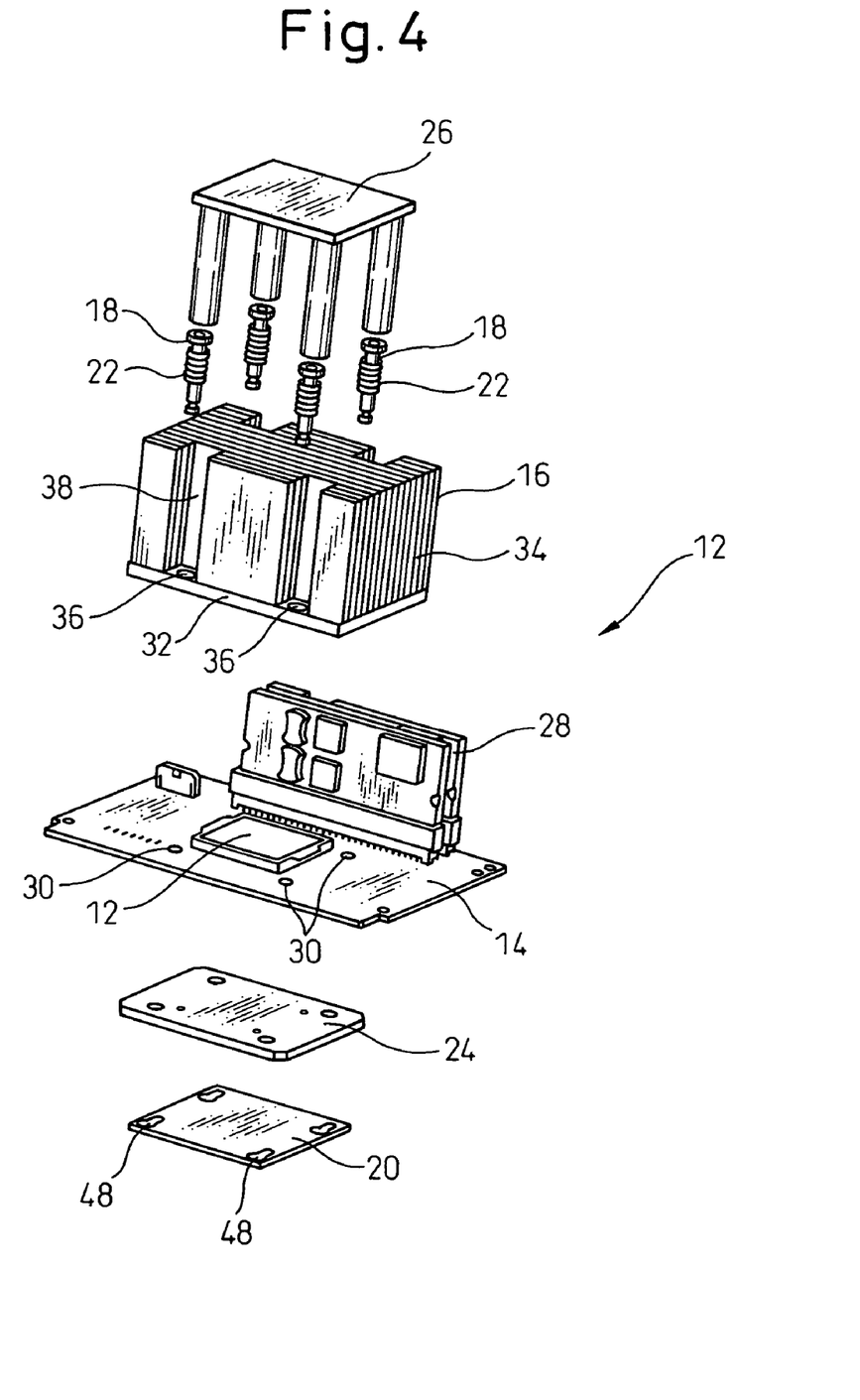
FIG. 4 is a perspective view illustrating the semiconductor device of FIG. 3.

The preferred embodiment of the present invention will now be described with reference to the drawings. FIG. 1 is a perspective view illustrating a semiconductor device according to the embodiment of the present invention. FIG. 2 is a side view illustrating the semiconductor device of FIG. 1. FIG. 3 is a perspective view illustrating the semiconductor device in the state in which it is being assembled, as viewed from the lower side. FIG. 4 is an exploded perspective view illustrating the semiconductor device of FIG. 3.

The semiconductor device 10 comprises a substrate 14 having a semiconductor element 12 mounted thereon, a heat sink 16 in contact with the semiconductor element 12 to cool the semiconductor element 12, and a securing structure for securing the heat sink 16 to the substrate 14. The securing structure comprises a plurality of pins 18 that are inserted in a plurality of holes 36 in the heat sink 16 and in a plurality of holes 30 in the substrate 14 and having enlarged portions at one ends thereof, an engaging member 20 that engages with the other ends of the pins 18 that pass through the holes 36 in the heat sink 16 and through the holes 30 in the substrate 14 and protrude from the substrate 14, and springs 22 arranged between the enlarged portions of the pins 18 and the heat sink 16. A plate member 24 is arranged between the substrate 14 and the engaging member 20.

In addition, a holding member 26 is used for assembling the semiconductor device 10. The holding member 26 is used for holding the pins 18 at the time of assembling the semiconductor device 10, and is removed from the pins 18 after the semiconductor device 10 is assembled.

The semiconductor element 12 is mounted nearly at the central portion of the substrate 14. The substrate 14 includes other electric/electronic elements. For example, a converter 28 for feeding power is mounted on the substrate 14. The substrate 14 has holes 30 around the semiconductor element 12 for inserting the pins 18.

The heat sink 16 comprises a heat sink plate 32 and fins 34 provided on the heat sink plate 32. The heat sink plate 32 is a portion that comes into contact with the semiconductor element 12, and has holes 36 for inserting the pins 18. The fins 34 are provided on the heat sink plate 32 at a region except for the positions where there are holes 36 for inserting the pins 18, and form cavities 38 around the holes 36 for inserting the pins 18. The pins 18 are located in the cavity portions 38, and the length between one end of the pin 18 and the substrate 14 is shorter than the height of the fins 34.

Figure 5:
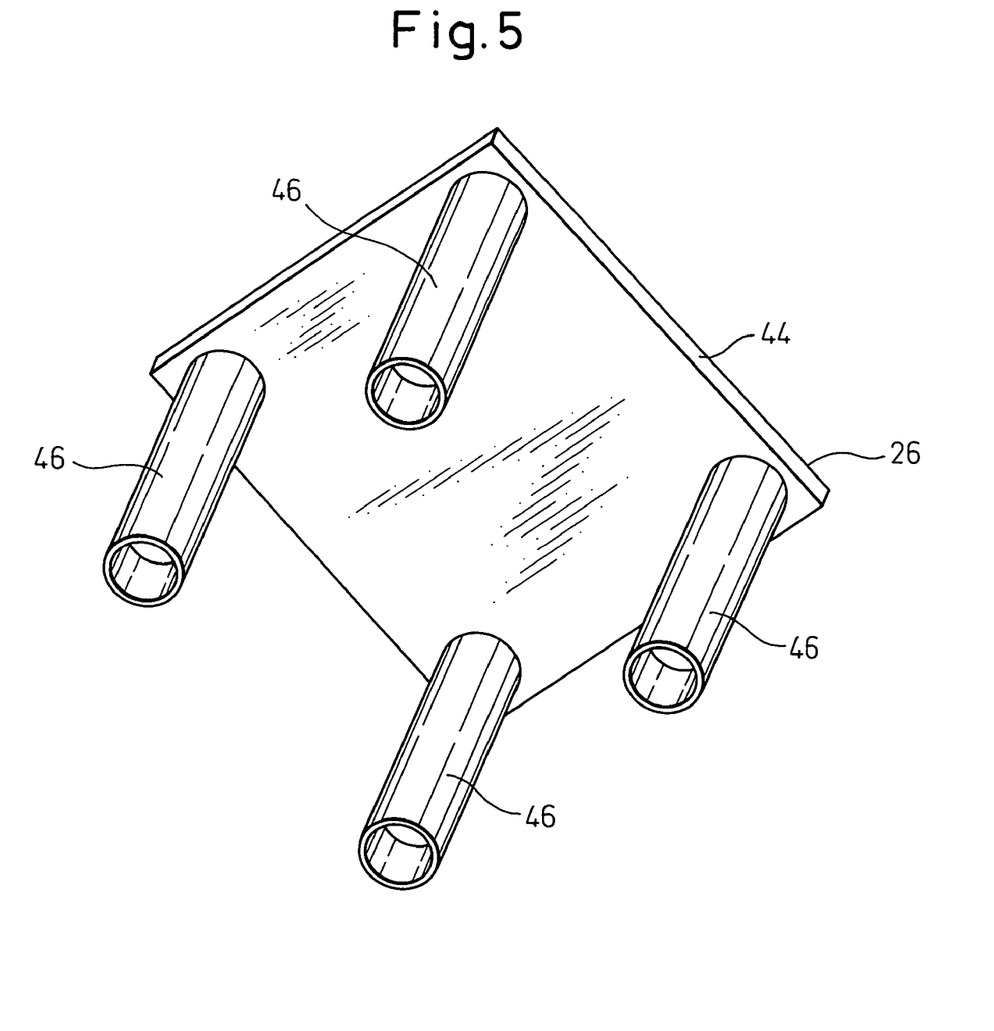
FIG. 5 is a perspective view illustrating a holding member.
Figure 6:
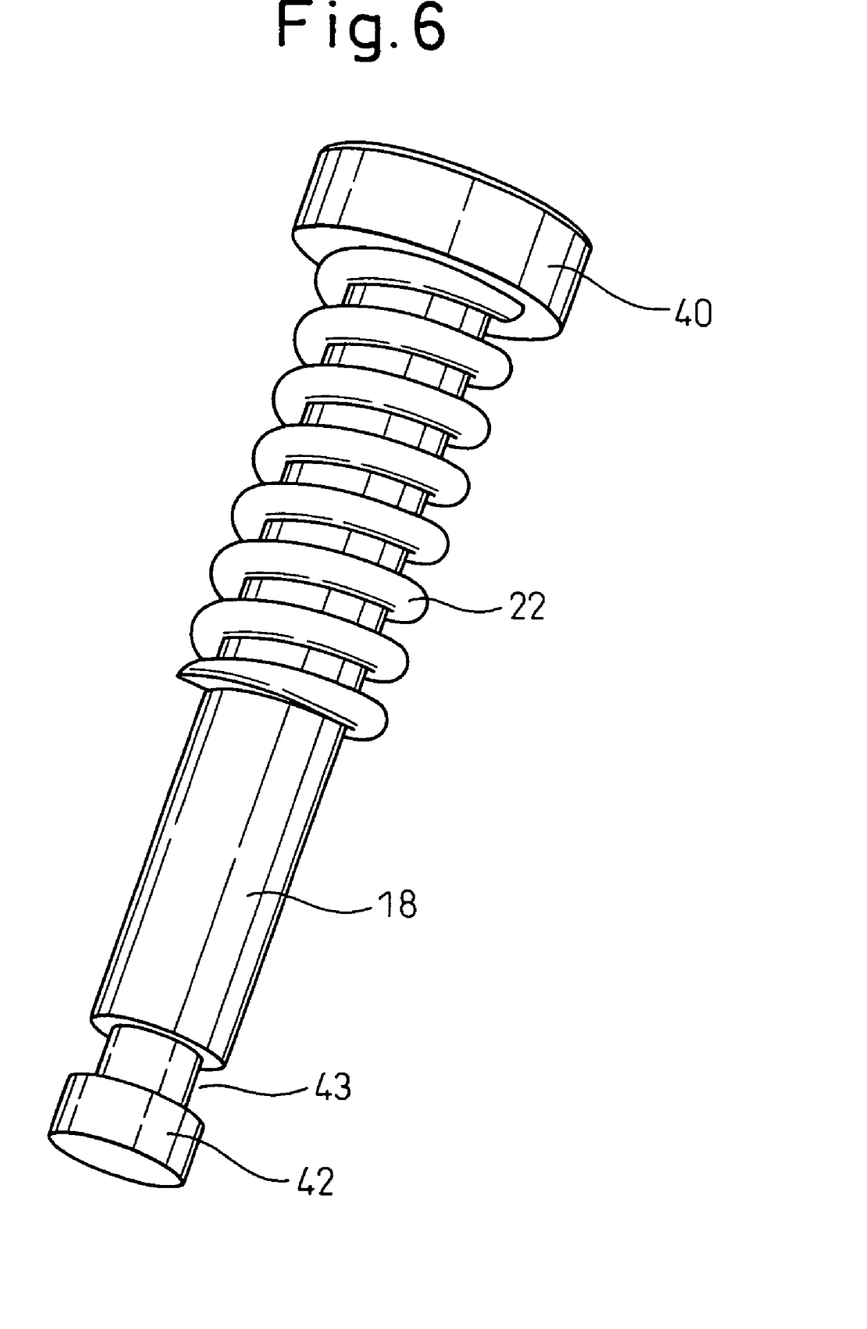
FIG. 6 is a perspective view of a pin on which a spring is arranged.

FIG. 5 is a perspective view illustrating the holding member 26. FIG. 6 is a perspective view illustrating the pin 18 with the spring 22 arranged thereon. The pin 18 has the enlarged portion 40 at one end thereof and an engaging portion 42 at the other end thereof. A neck portion 43 is formed between the body portion of the pin 18 and the engaging portion 42. The spring 22 is a coil spring arranged about the pin 18, and its one end is brought into contact with the enlarged portion 40. The other end of the spring 22 comes into contact with the surface of the heat sink plate 32 when the pin 18 is inserted in the hole 36 in the heat sink 16.

The holding member 26 has a plate-like body 44 and cylindrical support portions 46 for supporting the pins 18. The cylindrical support portions 46 are arranged at positions in alignment with the holes 36 and 30, so that the pins 18 are partially and loosely fitted in the cylindrical support portions 46. The end wall in the hollow portion of the cylindrical support portion 46 comes in contact with the enlarged portion 40 at the one end of the pin 18.

Figure 7:
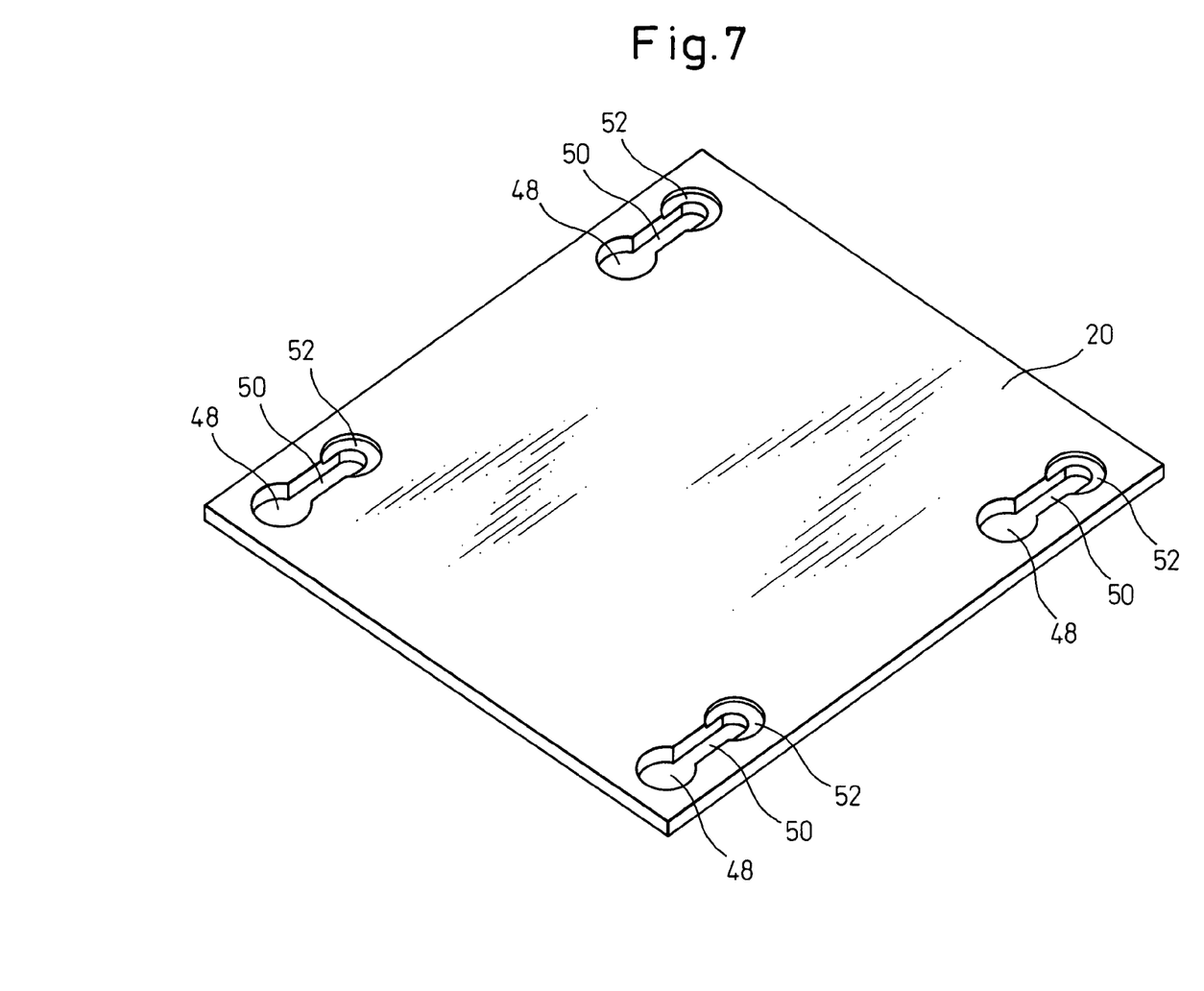
FIG. 7 is a perspective view illustrating an engaging member.

FIG. 7 is a perspective view illustrating the engaging member 20. The engaging member 20 is formed as a plate member and has holes 48 for inserting the pins 18 at positions corresponding to the holes 36 and 30. The engaging member 20 has slits 50 formed continuously to the holes 48 so that the neck portions 43 of the pins 18 pass therethrough when the engaging member 20 is transversely moved along the substrate 14, and holding grooves 52 formed at the ends of the slits 50 to hold the engaging portions 42 at the other ends of the pins 18. The holes 48 in the engaging member 20 have a size that permits the passage of the engaging portions 42 of the pins 18 at the other ends thereof, the slits 50 have a size that permit the passage of the neck portions 43, and the holding grooves 52 have a size that permits the engaging portions 42 to be fitted therein.

The engaging member 20 can move transversely along the substrate 14. The plate member 24 is arranged between the substrate 14 and the engaging member 20, so that the substrate 14 will not directly slide on the engaging member 20. The plate member 24 may be omitted.

Figure 8A:
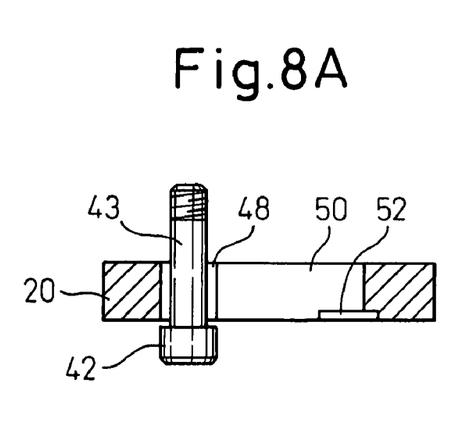
FIGS. 8A to 8F are views illustrating the pin and the engaging member of the semiconductor device after being assembled.
Figure 8B:
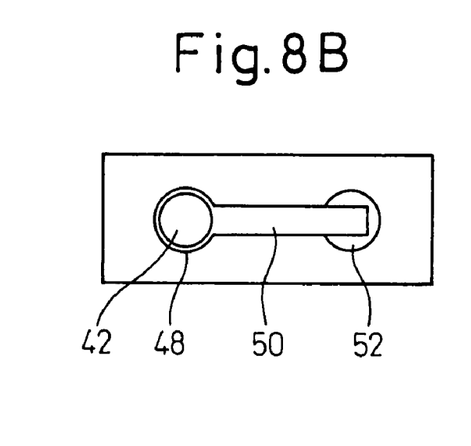
Figure 8C:
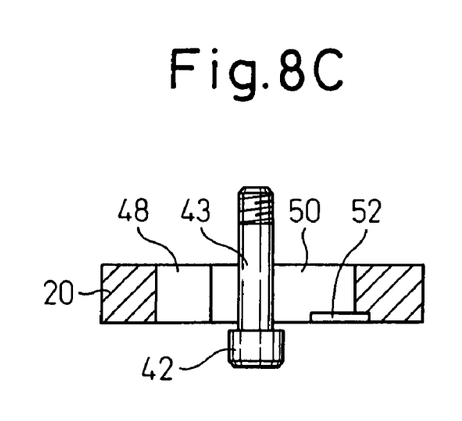
Figure 8D:
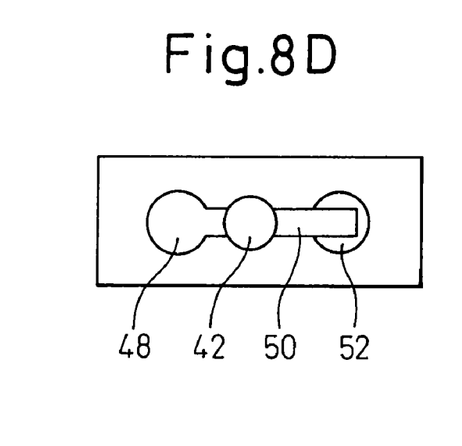
Figure 8E:
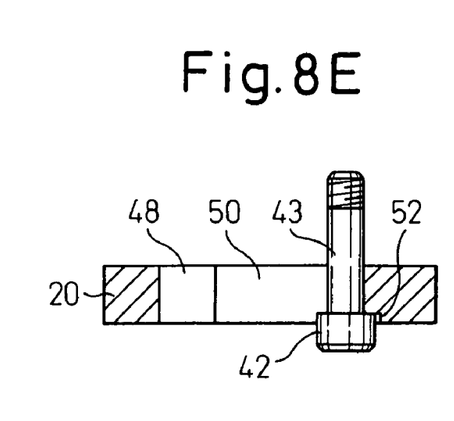
Figure 8F:
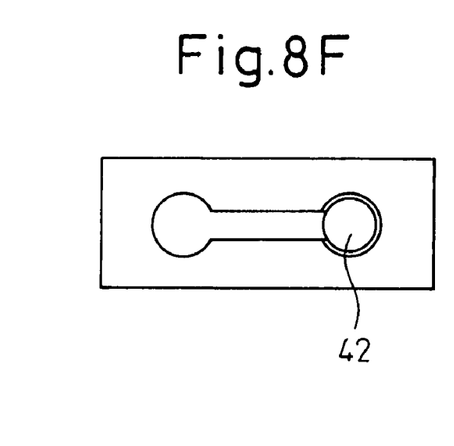

FIGS. 8A to 8F are views illustrating the pin 18 and the engaging member 20 of the semiconductor device in the state in which it is being assembled. FIGS. 8A, 8C and 8E are sectional views, and FIGS. 8B, 8D and 8F are bottom views of FIGS. 8A, 8C and 8E. In FIGS. 8A and 8B, the engaging portion 42 of the pin 18 passes through the hole 48 in the engaging member 20. In FIGS. 8C and 8D, the engaging member 20 moves transversely to the pin 18, and the neck portion 43 of the pin 18 is located in the slit 50 of the engaging member 20. In FIGS. 8E and 8F, the engaging portion 42 of the pin 18 is dropped and fitted in the holding groove 52 in the engaging member 20. In the state of FIGS. 8C and 8D, the pin 18 does not escape from the slit 50 of the engaging member 20 but may be accidentally moved if a transverse external force is applied to the pin 18 or to the engaging member. In the state of FIGS. 8E and 8F, the pin 18 does not easily escape from the holding groove 52 in the engaging member 20 despite a transverse external force being applied to the pin 18 or to the engaging member 20, and the position of the pin 18 is not accidentally moved.

In the case where the semiconductor device 10 is assembled, the holding member 26 is used as shown in FIGS. 3 and 4. A plurality of pins 18 having springs 22 arranged in contact with the enlarged portions 40 thereof are arranged in the holding member 26. That is, the enlarged portions 40 of the pins 18 at one ends thereof are inserted in the cylindrical support portions 46. The heat sink 16 is placed on the substrate 14, and the plate member 24 and the engaging member 20 are placed on the substrate 14.

At least one of the holding member 26 and the superposed heat sink 16 and substrate 14 is moved toward each other, and the plurality of pins 18 held by the holding member 26 are inserted in the holes 36 in the heat sink 16, the holes 30 in the substrate 14 and the holes 48 in the engaging member 20. The pins 18 and the cylindrical support portions 46 are guided into the holes 36 in the heat sink 16 along the cavity portions 38 formed in the fins 34. Here, friction may be imparted between the pins 18 and the cylindrical support portions 46 to such a degree that the pins 18 will not fall from the cylindrical support portions 46, or the pins 18 may be lightly supported by hand. Or, provisionally fixing pins may be provided in the cylindrical support members 46 to provisionally fix the pins 18. Or, the holding member 26 may be arranged in a stationary manner with the pins 18 and the cylindrical support members 46 being directed upwards, and the superposed heat sink 16 and substrate 14 may be lowered down toward the holding member 26.

The plurality of pins 18 are collectively held by the holding member 26 at a predetermined positional relationship, and therefore, the plurality of pins 18 can be inserted at one time in the plurality of holes 36 in the heat sink 16 and in the plurality of holes 30 in the substrate 14, by simply moving the holding member 26 and the superposed heat sink 16 and substrate 14 toward each other.

When the holding member 26, and the heat sink 16 and the substrate 14, placed one upon the other, are moved so as to approach each other, the springs 22 are compressed between the enlarged portions 40 at the one ends of the pins 18 and the heat sink 16, causing the heat sink 16 to be closely contacted to the substrate 14. That is, the resilient force of the springs 22 so works that the heat sink 16 is more closely contacted to the semiconductor element 12 on the substrate 14. Thus, the holding member 26 establishes the functions to position the pins 18 in position, to insert the pins in the holes 36, 30 and 48, and to compress the springs 22.

Therefore, the engaging portions 42 of the pins 18 pass through the holes 48 in the engaging member 20, as illustrated in FIGS. 8A and 8B, the neck portions 43 of the pins 18 pass through the slits 50 in the engaging member 20, as shown in FIGS. 8C and 8D, and the engaging portions 42 of the pins 18 are dropped and fitted in the holding grooves 52 of the engaging member 20, as illustrated in FIGS. 8E and 8F. As described above, the engaging portions 42 at the other ends of the pins 18 passing through the holes 36 in the heat sink 16 and the holes 30 in the substrate 14 and protruding from the substrate 14 are brought into engagement with the engaging member 20 to secure the assembly of the semiconductor device 10.

Then, the holding member 26 is removed from the pins 18. The semiconductor device 10 after having been assembled does not include the holding member 26 but includes the pins 18 only. The pins 18 may be shorter than the height of the fins 34, and the whole shape, and the weight, of the semiconductor device 10 are considerably decreased as compared to the case where the holding member 26 is included in the semiconductor device 10. Further, the holding member 26 that is removed can be repetitively used.

As described above, according to the present invention, a semiconductor device having an excellent heat-removing performance can be obtained at a low cost.

The invention claimed is:

1. A method of assembling a semiconductor device comprising:
   arranging, in a holding member comprising a plate-like body and a plurality of cylindrical support portions attached to said plate-like body for supporting pins, said pins having enlarged portions at one end thereof, the pins being loosely fitted in corresponding said plurality of cylindrical support portions;
   placing a heat sink on a substrate;
   moving at least one of said holding member and an assembly including the heat sink and the substrate placed one on another, toward each other to insert the pins held by said holding member in a plurality of holes in said heat sink and a plurality of holes in said substrate and to compress springs arranged in contact with the enlarged portions of the pins so that the heat sink and the substrate are closely contacted to each other;
   engaging ends opposite to the enlarged ends of said plurality of pins, passing through the plurality of holes in said heat sink and the plurality of holes in said substrate and protruding from the substrate, with an engaging member; and
   removing said holding member from said plurality of pins.

2. The method of assembling a semiconductor device according to claim 1, wherein height of said pins is less than height of the heat sink.

3. The method of assembling a semiconductor device according to claim 1, wherein each of the plurality of pins have a neck portion which is narrower than the ends opposite to the enlarged ends, the engaging member fitting around the neck portion of each pin in order to prevent the separation of the assembly including the heat sink and the substrate.

4. The method of assembling a semiconductor device according to claim 1, wherein the engaging member is removably engaged with the plurality of pins.

5. The method of assembling a semiconductor device according to claim 1, wherein the engaging member moves perpendicularly to an insertion direction of the plurality of pins.

6. The method of assembling a semiconductor device according to claim 1, wherein the springs spiral around the pins.

* * * * *